US011268047B2

(12) United States Patent
Scialla et al.

(10) Patent No.: US 11,268,047 B2
(45) Date of Patent: Mar. 8, 2022

(54) COMPOSITIONS CONTAINING AN ETHERAMINE

(71) Applicant: The Procter & Gamble Company, Cincinnati, OH (US)

(72) Inventors: Stefano Scialla, Strombeek-Bever (BE); Brian Joseph Loughnane, Sharonville, OH (US); Karie Marie Henke, Ross Township, OH (US); J. Frank Nash, Jr., West Chester, OH (US); Michael Patrick Hayes, Clarksville, OH (US); Bjoern Ludolph, Ludwigshafen (DE); Sophia Rosa Ebert, Mannheim (DE); Christian Eidamhaus, Mannheim (DE)

(73) Assignee: The Procter & Gamble Company, Cincinnati, OH (US)

( * ) Notice: Subject to any disclaimer, the term of this patent is extended or adjusted under 35 U.S.C. 154(b) by 76 days.

(21) Appl. No.: 16/797,519

(22) Filed: Feb. 21, 2020

(65) Prior Publication Data

US 2020/0190434 A1 Jun. 18, 2020

Related U.S. Application Data

(63) Continuation of application No. 15/463,017, filed on Mar. 20, 2017, now abandoned.

(60) Provisional application No. 62/312,628, filed on Mar. 24, 2016.

(51) Int. Cl.
| | |
|---|---|
| C11D 3/30 | (2006.01) |
| C11D 3/37 | (2006.01) |
| C11D 1/22 | (2006.01) |
| C11D 1/29 | (2006.01) |
| C11D 1/72 | (2006.01) |
| C11D 1/94 | (2006.01) |
| C11D 11/00 | (2006.01) |
| C11D 17/04 | (2006.01) |

(52) U.S. Cl.
CPC .................. *C11D 3/30* (2013.01); *C11D 1/22* (2013.01); *C11D 1/29* (2013.01); *C11D 1/72* (2013.01); *C11D 1/945* (2013.01); *C11D 3/3723* (2013.01); *C11D 11/0017* (2013.01); *C11D 17/042* (2013.01); *C11D 17/045* (2013.01)

(58) Field of Classification Search
CPC ................................ C11D 3/30; C11D 3/3723
USPC .................. 510/475, 499, 505, 506
See application file for complete search history.

(56) References Cited

U.S. PATENT DOCUMENTS

| | | |
|---|---|---|
| 3,654,370 A | 4/1972 | Yeakey |
| 3,862,227 A | 1/1975 | Haug |
| 4,450,091 A | 5/1984 | Schmolka |
| 4,556,509 A | 12/1985 | Demangeon |
| 4,609,683 A | 9/1986 | Grigsby, Jr. |
| 4,764,291 A | 8/1988 | Steltenkamp |
| 4,820,436 A | 4/1989 | Andree |
| 5,571,286 A | 11/1996 | Connell |
| 5,863,886 A | 1/1999 | Tracy |
| 5,948,744 A | 9/1999 | Baillely |
| 6,146,427 A | 11/2000 | Crutcher |
| 6,172,021 B1 | 1/2001 | Ofosu-asante |
| 6,172,024 B1 | 1/2001 | Arvanitidou |
| 6,191,099 B1 | 2/2001 | Crutcher |
| 6,347,055 B1 | 2/2002 | Motomura |
| 6,365,561 B1 | 4/2002 | Vinson |
| 6,369,024 B1 | 4/2002 | Panandiker |
| 6,437,055 B1 | 8/2002 | Moriarity |
| 6,444,631 B1 | 9/2002 | Ofosu-asante |
| 6,506,716 B1 | 1/2003 | Delplancke |
| 6,589,926 B1 | 7/2003 | Vinson |
| 6,652,667 B2 | 11/2003 | Ahmadi |
| 6,710,023 B1 | 3/2004 | Bodet |
| 6,857,485 B2 | 2/2005 | Patel |
| 6,951,710 B2 | 10/2005 | Rieker |
| 7,037,883 B2 | 5/2006 | Hsu |
| 7,387,992 B2 | 6/2008 | Hsu |
| 7,816,481 B2 | 10/2010 | Klein |
| 8,097,577 B2 | 1/2012 | Danziger et al. |
| 8,193,144 B2 | 6/2012 | Tanner |
| 8,247,368 B2 | 8/2012 | Danziger |
| 8,471,065 B2 | 6/2013 | Burton |
| 8,586,039 B2 | 11/2013 | Tsuchiya |
| 8,815,007 B2 | 8/2014 | Tanner |
| 9,193,939 B2 | 11/2015 | Hulskotter |
| 9,388,368 B2 | 7/2016 | Loughnane |
| 9,487,739 B2 | 11/2016 | Loughnane |
| 9,540,592 B2 | 1/2017 | Hulskotter |
| 9,550,965 B2 | 1/2017 | Hulskotter |
| 9,617,501 B2 | 4/2017 | Panandiker |
| 9,617,502 B2 | 4/2017 | Loughnane |
| 9,631,163 B2 | 4/2017 | Hulskotter |
| 9,719,052 B2 | 8/2017 | Hulskotter |

(Continued)

FOREIGN PATENT DOCUMENTS

| | | |
|---|---|---|
| DE | 1643426 B2 | 3/1975 |
| EP | 1664254 B9 | 3/2008 |

(Continued)

OTHER PUBLICATIONS

All Office Actions; U.S. Appl. No. 15/463,017.
www.huntsman.com/portal/page/.../jeffamine polyetheramines.

(Continued)

*Primary Examiner* — Gregory R Delcotto
(74) *Attorney, Agent, or Firm* — Carrie Schwartz

(57) ABSTRACT

The present disclosure relates generally to cleaning compositions and, more specifically, to cleaning compositions containing an etheramine that is suitable for removal of stains from soiled materials.

13 Claims, No Drawings

(56) References Cited

U.S. PATENT DOCUMENTS

| | | |
|---|---|---|
| 9,725,680 B2 | 8/2017 | Panandiker |
| 9,752,101 B2 | 9/2017 | Loughnane |
| 9,771,546 B2 | 9/2017 | Panandiker |
| 9,850,452 B2 | 12/2017 | Fossum et al. |
| 10,174,274 B2 * | 1/2019 | Loughnane ............... C11D 1/38 |
| 10,414,856 B2 * | 9/2019 | Ebert ...................... B29C 35/00 |
| 2002/0147368 A1 | 10/2002 | Li |
| 2005/0027141 A1 | 2/2005 | Furushima |
| 2006/0074004 A1 | 4/2006 | Johnson |
| 2010/0323943 A1 | 12/2010 | Evers |
| 2011/0009670 A1 | 1/2011 | Klein |
| 2012/0259075 A1 | 10/2012 | Klein |
| 2012/0309884 A1 | 12/2012 | Walker |
| 2013/0291315 A1 | 11/2013 | Bennett |
| 2014/0255330 A1 | 9/2014 | Cron et al. |
| 2014/0296124 A1 | 10/2014 | Hulskotter |
| 2014/0296127 A1 | 10/2014 | Hulskotter |
| 2015/0275143 A1 | 10/2015 | Hulskotter |
| 2015/0275144 A1 | 10/2015 | Hulskotter |
| 2015/0315523 A1 | 11/2015 | Hulskotter et al. |
| 2015/0315524 A1 | 11/2015 | Hulskotter |
| 2016/0052867 A1 | 2/2016 | Ebert |
| 2016/0060571 A1 | 3/2016 | Panandiker |
| 2016/0060572 A1 | 3/2016 | Panandiker |
| 2016/0060573 A1 | 3/2016 | Fossum |
| 2016/0075975 A1 | 3/2016 | Loughnane |
| 2016/0090551 A1 | 3/2016 | Fossum |
| 2016/0090552 A1 | 3/2016 | Loughnane |
| 2016/0090563 A1 * | 3/2016 | Loughnane ............... C11D 1/02 510/276 |
| 2017/0121635 A1 | 5/2017 | Delplancke |
| 2017/0121642 A1 | 5/2017 | Loughnane et al. |
| 2017/0275565 A1 | 9/2017 | Scialla et al. |
| 2017/0275566 A1 | 9/2017 | Scialla et al. |
| 2018/0037856 A1 | 2/2018 | Keuleers et al. |
| 2020/0193079 A1 | 6/2020 | Scialla et al. |

FOREIGN PATENT DOCUMENTS

| | | |
|---|---|---|
| EP | 1436374 B1 | 8/2008 |
| JP | 2011001504 A | 1/2011 |
| WO | WO8607603 A1 | 12/1986 |
| WO | WO9003423 A1 | 4/1990 |
| WO | WO9730103 A3 | 12/1997 |
| WO | WO0063334 A1 | 10/2000 |
| WO | WO0127232 A1 | 4/2001 |
| WO | WO0176729 A3 | 10/2002 |
| WO | WO2009065738 A3 | 9/2009 |
| WO | WO2012126665 A1 | 9/2012 |

OTHER PUBLICATIONS

International Search Report for PCT/US2014/031939, dated Jul. 7, 2014, containing 14 pages.

International Search Report for PCT/US2014/031941, dated Jul. 3, 2014, containing 14 pages.

PCT Search Report for application No. PCT/US2017/023693, dated Jun. 26, 2017, 13 pages.

PCT Search Report for application No. PCT/US2017/023695, dated Jun. 1, 2017, 14 pages.

All Office Actions, U.S. Appl. No. 16/796,344.

All Office Actions; U.S. Appl. No. 15/462,999.

* cited by examiner

COMPOSITIONS CONTAINING AN ETHERAMINE

TECHNICAL FIELD

Joint Research Agreement

The inventions described and claimed herein were made pursuant to a Joint Research Agreement between The Procter & Gamble Company and BASF SE of Ludwigshafen, Germany.

The present disclosure relates generally to cleaning compositions and, more specifically, to cleaning compositions containing an etheramine that is suitable for removal of stains from soiled materials.

BACKGROUND

Due to the increasing popularity of easy-care fabrics made of synthetic fibers as well as the ever increasing energy costs and growing ecological concerns of detergent users, the once popular warm and hot water washes have now taken a back seat to washing fabrics in cold water (30° C. and below). Many commercially available laundry detergents are even advertised as being suitable for washing fabrics at 15° C. or even 9° C. To achieve satisfactory washing results at such low temperatures, results comparable to those obtained with hot-water washes, the demands on low-temperature detergents are especially high.

It is known to include certain additives in detergent compositions to enhance the detergent power of conventional surfactants, so as to improve the removal of grease stains at temperatures of 30° C. and below. For example, laundry detergents containing an aliphatic amine compound, in addition to at least one synthetic anionic and/or nonionic surfactant, are known. Also, the use of linear, alkyl-modified (secondary) alkoxypropylamines in laundry detergents to improve cleaning at low temperatures is known. These known laundry detergents, however, are unable to achieve satisfactory cleaning at cold temperatures.

Furthermore, the use of linear, primary polyoxyalkyleneamines (e.g., Jeffamine® D-230) to stabilize fragrances in laundry detergents and provide longer lasting scent is also known. Also, the use of high-molecular-weight (molecular weight of at least about 1000), branched, trifunctional, primary amines (e.g., Jeffamine® T-5000 etheramine) to suppress suds in liquid detergents is known. Additionally, an etheramine mixture containing a monoether diamine (e.g., at least 10% by weight of the etheramine mixture), methods for its production, and its use as a curing agent or as a raw material in the synthesis of polymers are known. Finally, the use of compounds derived from the reaction of diamines or polyamines with alkylene oxides and compounds derived from the reaction of amine terminated polyethers with epoxide functional compounds to suppress suds is known.

Also, cleaning compositions comprising a surfactant system and a polyetheramine of Formula (I), Formula (II), or a mixture thereof:

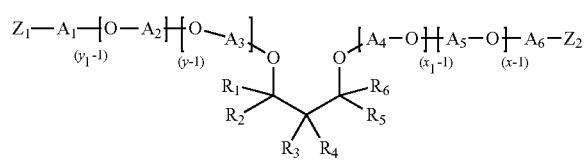

Formula (I)

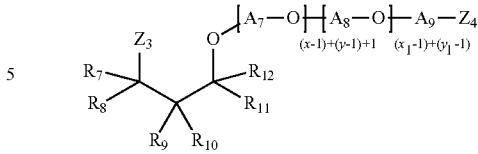

Formula (II)

where each of $R_1$-$R_{12}$ is independently selected from H, alkyl, cycloalkyl, aryl, alkylaryl, or arylalkyl, where at least one of $R_1$-$R_6$ and at least one of $R_7$-$R_{12}$ is different from H, each of $A_1$-$A_9$ is independently selected from linear or branched alkylenes having 2 to 18 carbon atoms, each of $Z_1$-$Z_4$ is independently selected from OH or $NH_2$, where at least one of $Z_1$-$Z_2$ and at least one of $Z_3$-$Z_4$ is $NH_2$, where the sum of x+y is in the range of about 2 to about 200, where $x \geq 1$ and $y>1$, and the sum of $x_1+y_1$ is in the range of about 2 to about 200, where $x_1 \geq 1$ and $y_1 \geq 1$, are known. These cleaning compositions can provide increased grease removal, particularly in cold water, e.g., at 30° C. or even lower.

There is a continuing need for a detergent additive that can improve cleaning performance at low wash temperatures, e.g., at 30° C. or even lower, without interfering with the production and the quality of the laundry detergents in any way. More specifically, there is a need for a detergent additive that can improve cold water grease cleaning, without adversely affecting particulate cleaning. Surprisingly, it has been found that the cleaning compositions of the invention provide increased grease removal (particularly in cold water). These polyetheramine compounds provide surprisingly effective grease removal.

SUMMARY

A method of forming an etheramine is disclosed. The method comprising reductive cyanoethylation of an alkoxylated 1,3-diol mixture with an acrylonitrile in the presence of a base followed by hydrogenation with hydrogen and a catalyst to form an etheramine of Formula (I), Formula (II), or a mixture thereof:

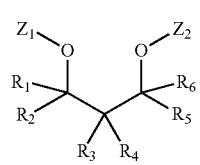

Formula (I)

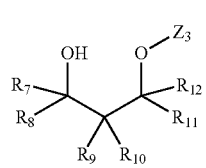

Formula (II)

where each of $R_1$-$R_{12}$ is independently selected from H, alkyl, cycloalkyl, aryl, alkylaryl, or arylalkyl, where at least one of $R_1$-$R_6$ and at least one of $R_7$-$R_{12}$ is different from H, and where each of $Z_1$-$Z_3$ is linear $CH_2CH_2CH_2NH_2$.

DETAILED DESCRIPTION

Features and benefits of the present invention will become apparent from the following description, which includes examples intended to give a broad representation of the invention. Various modifications will be apparent to those skilled in the art from this description and from practice of the invention. The scope is not intended to be limited to the particular forms disclosed and the invention covers all modifications, equivalents, and alternatives falling within the spirit and scope of the invention as defined by the claims.

As used herein, the articles including "the," "a" and "an" when used in a claim or in the specification, are understood to mean one or more of what is claimed or described.

As used herein, the terms "include," "includes" and "including" are meant to be non-limiting.

The term "substantially free of" or "substantially free from" as used herein refers to either the complete absence of an ingredient or a minimal amount thereof merely as impurity or unintended byproduct of another ingredient. A composition that is "substantially free" of/from a component means that the composition comprises less than about 0.5%, 0.25%, 0.1%, 0.05%, or 0.01%, or even 0%, by weight of the composition, of the component.

As used herein the phrases "detergent composition" and "cleaning composition" are used interchangeably and include compositions and formulations designed for cleaning soiled material. Such compositions include but are not limited to, laundry cleaning compositions and detergents, fabric softening compositions, fabric enhancing compositions, fabric freshening compositions, laundry prewash, laundry pretreat, laundry additives, spray products, dry cleaning agent or composition, laundry rinse additive, wash additive, post-rinse fabric treatment, ironing aid, dish washing compositions, hard surface cleaning compositions, unit dose formulation, delayed delivery formulation, detergent contained on or in a porous substrate or nonwoven sheet, and other suitable forms that may be apparent to one skilled in the art in view of the teachings herein. Such compositions may be used as a pre-laundering treatment, a post-laundering treatment, or may be added during the rinse or wash cycle of the laundering operation.

The term "etheramine" includes the term "polyetheramine" and includes amines that have one or more ether groups.

The term "linear" refers to a straight chain, non-branched hydrocarbon.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within such broader numerical range, as if such narrower numerical ranges were all expressly written herein.

All cited patents and other documents are, in relevant part, incorporated by reference as if fully restated herein. The citation of any patent or other document is not an admission that the cited patent or other document is prior art with respect to the present invention.

In this description, all concentrations and ratios are on a weight basis of the detergent composition unless otherwise specified.

Composition

The compositions of the present disclosure may be detergent compositions, more specifically laundry detergent compositions. The compositions may have a form selected from liquid, powder, single-phase or multi-phase unit dose, pouch, tablet, gel, paste, bar, flake. The compositions may have a form selected from the group consisting of a liquid laundry detergent, a gel detergent, a single-phase or multi-phase unit dose detergent, a detergent contained in a single-phase or multi-phase or multi-compartment water-soluble pouch, a liquid hand dishwashing composition, a laundry pretreat product, a fabric softener composition, and mixtures thereof.

The term "liquid" encompasses aqueous compositions, non-aqueous compositions, gels, pastes, dispersions and the like. The phrase "laundry detergent composition," as used herein, means a composition that can be used in a laundry wash and/or rinse operation. A laundry detergent composition can also be a laundry pre-treatment composition. The composition may be a liquid laundry detergent composition that is present in a water-soluble unit dose article.

The compositions of the present disclosure may be detergent compositions and may comprise an etheramine. Suitable etheramines are described in more detail below.

Etheramines

The compositions disclosed herein may comprise an etheramine The compositions may comprise from about 0.1% to about 10%, or from about 0.2% to about 5%, or from about 0.5% to about 3%, by weight of the composition, of an etheramine of Formula (I), Formula (II), or a mixture thereof:

Formula (I)

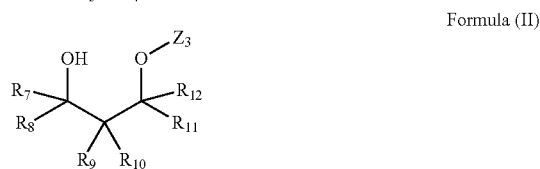

Formula (II)

where each of $R_1$-$R_{12}$ is independently selected from H, alkyl, cycloalkyl, aryl, alkylaryl, or arylalkyl, where at least one of $R_1$-$R_6$ and at least one of $R_7$-$R_{12}$ is different from H, and wherein each of $Z_1$-$Z_3$ is linear $CH_2CH_2CH_2NH_2$. Optionally, the composition may comprise a diol of Formula (III):

Formula (III)

where $R_1$-$R_6$ are independently selected from H, alkyl, cycloalkyl, aryl, alkylaryl, or arylalkyl, where at least one of $R_1$-$R_6$ is different from H.

The etheramine of Formula (I) and the etheramine of Formula (II) each comprises linear propylamine groups ($CH_2CH_2CH_2NH_2$). Without being bound by theory, it is believed that such etheramines of Formula (I) and Formula (II) provide improved grease removal.

In Formula (I) or (II), $R_1$, $R_2$, $R_5$, $R_6$, $R_7$, $R_8$, $R_{11}$, and $R_{12}$ may each be H, and each of $R_3$, $R_4$, $R_9$, and $R_{10}$ may be independently selected from $C_{1-16}$ alkyl or aryl. Each of $R_1$, $R_2$, $R_5$, $R_6$, $R_7$, $R_8$, $R_{11}$, and $R_{12}$ may be H and each of $R_3$, $R_4$, $R_9$, and $R_{10}$ may be independently selected from a butyl group, an ethyl group, a methyl group, a propyl group, or a phenyl group. In Formula (I) or (II), $R_3$ and $R_9$ may each be an ethyl group, and each of $R_1$, $R_2$, $R_5$, $R_6$, $R_7$, $R_8$, $R_{11}$, and $R_{12}$ may be each H, and/or $R_4$ and $R_{10}$ may each be a butyl group. Each of $R_1$, $R_2$, $R_7$, and $R_8$ may be H and each of $R_3$, $R_4$, $R_5$, $R_6$, $R_9$, $R_{10}$, $R_{11}$, and $R_{12}$ may be independently selected from an ethyl group, a methyl group, a propyl group, a butyl group, a phenyl group, or H.

The etheramine may comprise a mixture of the compound of Formula (I) and the compound of Formula (II).

The etheramine of Formula (I) or Formula (II) may have a weight average molecular weight of about 150 to about 1000 grams/mol, about 150 to about 900 grams/mol, about 150 to about 700 grams/mol, about 150 to about 450 grams/mol, about 290 to about 900 grams/mol, about 290 to about 700 grams/mol, or about 300 to about 450 grams/mol. The molecular mass of a polymer differs from typical molecules in that polymerization reactions produce a distribution of molecular weights, which is summarized by the weight average molecular weight. The etheramine polymers of the invention are thus distributed over a range of molecular weights.

The etheramine may comprise an etheramine mixture comprising at least 90%, by weight of the etheramine mixture, of the etheramine of Formula (I), the etheramine of Formula (II), or a mixture thereof. The etheramine may comprise an etheramine mixture comprising at least 95%, by weight of the etheramine mixture, of the etheramine of Formula (I), the etheramine of Formula (II), or a mixture thereof.

The etheramine of Formula (I) and/or the etheramine of Formula (II) may be obtainable by reductive cyanoethylation of 1,3-diols of formula (III):

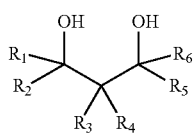

Formula (III)

where $R_1$-$R_6$ are independently selected from H, alkyl, cycloalkyl, aryl, alkylaryl, or arylalkyl, where at least one of $R_1$-$R_6$ is different from H.

Generally, as used herein, the term "obtainable by" means that corresponding products do not necessarily have to be produced (i.e. obtained) by the corresponding method or process described in the respective specific context, but also products are comprised which exhibit all features of a product produced (obtained) by said corresponding method or process, wherein said products were actually not produced (obtained) by such method or process. However, the term "obtainable by" also comprises the more limiting term "obtained by", i.e. products which were actually produced (obtained) by a method or process described in the respective specific context.

In the 1,3-diol of formula (III), $R_1$, $R_2$, $R_5$, and $R_6$ may be H and $R_3$ and $R_4$ may be $C_{1-16}$ alkyl or aryl. The 1,3-diol of formula (III) may be selected from 2-butyl-2-ethyl-1,3-propanediol, 2-methyl-2-propyl-1,3-propanediol, 2-methyl-2-phenyl-1,3-propanediol, 2,2-dimethyl-1,3-propanediol, 2-ethyl-1,3-hexanediol, or a mixture thereof.

Amination of the 1,3-diols may be carried out by reductive cyanoethylation, and produces structures represented by Formula I and/or Formula II:

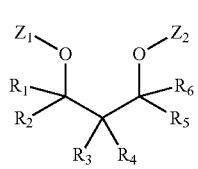

Formula (I)

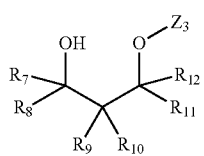

Formula (II)

where each of $R_1$-$R_{12}$ is independently selected from H, alkyl, cycloalkyl, aryl, alkylaryl, or arylalkyl, where at least one of $R_1$-$R_6$ and at least one of $R_7$-$R_{12}$ is different from H, and wherein each of $Z_1$-$Z_3$ is linear $CH_2CH_2CH_2NH_2$. Optionally, the product of reductive cyanoethylation may also comprise diol(s) of Formula (III).

The reductive cyanoethylation may be carried out by reaction of the 1,3-diol (Formula III) with acrylonitrile in the presence of a base followed by hydrogenation with hydrogen and a catalyst. The use of acrylonitrile produces linear propylamine end groups according to the present disclosure.

Suitable bases include alkaline hydroxides and substituted ammonium hydroxide. Tetrakis(2-hydroxyethyl)ammonium hydroxide may be used as a base.

As catalysts for hydrogenation of the nitrile function to the corresponding amine, catalysts which comprise one or more elements of the 8th transition group of the Periodic Table (Fe, Co, Ni, Ru, Rh, Pd, Os, Ir, Pt), or Fe, Co, Ni, Ru or Rh, or Co or Ni may be used. Catalysts which comprise Co, as an active component, may be used. A further suitable active component is Cu.

The abovementioned catalysts can be doped in a known way with promoters, for example, chromium, iron, cobalt, manganese, molybdenum, titanium, tin, metals of the alkali metal group, metals of the alkaline earth metal group, and/or phosphorus.

The catalyst may be a skeletal catalyst (also referred to as Raney® type, hereinafter also: Raney catalyst) that is obtained by leaching (activating) an alloy of hydrogenation-active metal and a further component (e.g., Al). Suitably catalysts include Raney nickel catalysts and Raney cobalt catalysts.

Supported Pd or Pt catalysts may also be used as catalysts. Suitable support materials include activated carbon, $Al_2O_3$, $TiO_2$, $ZrO_2$ and $SiO_2$. The catalyst may be produced by reduction of catalyst precursors.

The catalyst precursor may comprise an active composition that comprises one or more catalytically active components, optionally promoters, and optionally a support material.

The catalytically active components comprise oxygen-comprising compounds of the above-mentioned metals, for example the metal oxides or hydroxides thereof, e.g., CoO, NiO, CuO and/or mixed oxides thereof.

As used herein, the term "catalytically active components" refers to the abovementioned oxygen-comprising metal compounds but is not intended to mean that these oxygen-comprising compounds are themselves catalytically active. The catalytically active components generally display catalytic activity in the reaction according to the disclosure only after reduction.

Suitable catalyst precursors include the oxide mixtures which are disclosed in EP-A-0636409 and before reduction with hydrogen comprise from 55 to 98% by weight of Co, calculated as CoO, from 0.2 to 15% by weight of phosphorus, calculated as $H_3PO_4$, from 0.2 to 15% by weight of manganese, calculated as $MnO_2$, and from 0.2 to 5.0% by weight of alkali metal, calculated as $M_2O$ (M=alkali metal), or oxide mixtures which are disclosed in EP-A-0742045 and before reduction with hydrogen comprise from 55 to 98% by weight of Co, calculated as CoO, from 0.2 to 15% by weight of phosphorus, calculated as $H_3PO_4$, from 0.2 to 15% by weight of manganese, calculated as MnO2, and from 0.05 to 5% by weight of alkali metal, calculated as $M_2O$ (M=alkali metal), or oxide mixtures which are disclosed EP-A-0742045 and before reduction with hydrogen comprise from 55 to 98% by weight of Co, calculated as CoO, from 0.2 to 15% by weight of phosphorus, calculated as H3PO4, from 0.2 to 15% by weight of manganese, calculated as $MnO_2$, and from 0.05 to 5% by weight of alkali metal, calculated as M2O (M=alkali metal).

Alternatively, sponge type catalysts of cobalt and nickel can be used.

The process can be carried out in a continuous or discontinuous mode, e.g., in an autoclave, tube reactor or fixed-bed reactor. The reactor design is also not narrowly critical. The feed thereto may be upflowing or downflowing, and design features in the reactor which optimize plug flow in the reactor may be employed.

The degree of amination of the etheramine comprising the etheramine of Formula (I), the etheramine of Formula (II), or a mixture thereof may be equal to or greater than about 50%, or equal to or greater than about 55%, or in the range of from about 60% to about 95%, or from about 65% to about 90%, or from about 70% to about 85%. The degree of amination may be calculated from the total amine value (AZ) divided by sum of the total acetylables value (AC) and tertiary amine value (tert. AZ) multiplied by 100: (Total AZ: (AC+tert. AZ))×100). The total amine value (AZ) is determined according to DIN 16945. The total acetylables value (AC) is determined according to DIN 53240. The secondary and tertiary amine are determined according to ASTM D2074-07.

The primary amines value may be calculated as follows: primary amine value=AZ−secondary+tertiary amine value. Primary amine in % of total amine is calculated as follows: Primary amine in %=((AZ−secondary+tertiary amine value)/AZ)*100.

The hydroxyl value is calculated from (total acetylables value+tertiary amine value)−total amine value.

The etheramines of the disclosure are effective for removal of stains, particularly grease. Also, cleaning compositions containing the etheramines of the disclosure do not exhibit the cleaning negatives seen with some conventional amine-containing cleaning compositions on hydrophilic bleachable stains, such as coffee, tea, wine, or particulates.

A further advantage of cleaning compositions containing the etheramines of the invention is their ability to remove grease stains in cold water, for example, via pretreatment of a grease stain followed by cold water washing. Without being limited by theory, it is believed that cold water washing solutions have the effect of hardening or solidifying grease, making the grease more resistant to removal, especially on fabric. Cleaning compositions containing the etheramines of the invention are surprisingly effective when used as part of a pretreatment regimen followed by cold water washing.

The etheramines of the invention may be used in the form of a water-based, water-containing, or water-free solution, emulsion, gel or paste of the etheramine together with an acid such as, for example, citric acid, lactic acid, sulfuric acid, methanesulfonic acid, hydrogen chloride, e.g., aqeous hydrogen chloride, phosphoric acid, formic acid, acetic acid, propionic acid, valeric acid, oxalic acid, succinic acid, adipic acid, sebacic acid, glutaric acid, glucaric acid, tartaric acid, malic acid, benzoic acid, salicylic acid, phthalic acid, oleic acid, stearic acid, caproic acid, caprylic acid, capric acid, lauric acid, myristic acid, palmitic acid, linoleic acid or mixtures thereof. The acid may be selected from the group consisting of caproic acid, caprylic acid, capric acid, lauric acid, myristic acid, and mixtures thereof. Alternatively, the acid may be represented by a surfactant, such as, alkyl benzene sulphonic acid, alkylsulphonic acid, monoalkyl esters of sulphuric acid, mono alkylethoxy esters of sulphuric acid, fatty acids, alkyl ethoxy carboxylic acids, and the like, or mixtures thereof. When applicable or measurable, the preferred pH of the solution or emulsion ranges from pH 3 to pH 11, or from pH 6 to pH 9.5, even more preferred from pH 7 to pH 8.5.

Surfactant

The compositions disclosed herein may comprise a surfactant selected from the group consisting of anionic surfactants, nonionic surfactants, cationic surfactants, zwitterionic surfactants, amphoteric surfactants, ampholytic surfactants, and mixtures thereof.

Anionic Surfactant

The compositions of the present disclosure may comprise at least about 10%, or at least about 20%, or at least about 30%, or at least about 50%, or at least about 60%, or at least about 70% by weight of an anionic surfactant. The compositions of the present disclosure may comprise less than 100%, or less than 90%, or less than about 85%, or less than about 75%, or less than about 70% by weight of an anionic surfactant. The compositions of the present disclosure may comprise from about 10% to about 50%, or about 20% to about 70%, or about 30% to about 75%, or about 30% to about 65%, or about 35% to about 65%, or about 40% to about 60%, of an anionic surfactant.

The anionic surfactants may exist in an acid form, and the acid form may be neutralized to form a surfactant salt. Typical agents for neutralization include metal counterion bases, such as hydroxides, e.g., NaOH or KOH. Further suitable agents for neutralizing anionic surfactants in their acid forms include ammonia, amines, or alkanolamines Non-limiting examples of alkanolamines include monoethanolamine, diethanolamine, triethanolamine, and other linear or branched alkanolamines known in the art; suitable alkanolamines include 2-amino-1-propanol, 1-aminopropanol, monoisopropanolamine, or 1-amino-3-propanol. Amine neutralization may be done to a full or partial extent, e.g., part of the anionic surfactant mix may be neutralized with sodium or potassium and part of the anionic surfactant mix may be neutralized with amines or alkanolamines.

Non-limiting examples of suitable anionic surfactants include any conventional anionic surfactant. This may include a sulfate detersive surfactant, for e.g., alkoxylated and/or non-alkoxylated alkyl sulfate materials, and/or sulfonic detersive surfactants, e.g., alkyl benzene sulfonates. Suitable anionic surfactants may be derived from renewable resources, waste, petroleum, or mixtures thereof. Suitable anionic surfactants may be linear, partially branched, branched, or mixtures thereof Alkoxylated alkyl sulfate materials comprise ethoxylated alkyl sulfate surfactants, also known as alkyl ether sulfates or alkyl polyethoxylate sulfates. Examples of ethoxylated alkyl sulfates include water-soluble salts, particularly the alkali metal, ammonium and alkylolammonium salts, of organic sulfuric reaction products having in their molecular structure an alkyl group containing from about 8 to about 30 carbon atoms and a sulfonic acid and its salts. (Included in the term "alkyl" is the alkyl portion of acyl groups. In some examples, the alkyl group contains from about 15 carbon atoms to about 30 carbon atoms. In other examples, the alkyl ether sulfate surfactant may be a mixture of alkyl ether sulfates, said mixture having an average (arithmetic mean) carbon chain length within the range of about 12 to 30 carbon atoms, and in some examples an average carbon chain length of about 12 to 15 carbon atoms, and an average (arithmetic mean) degree of ethoxylation of from about 1 mol to 4 mols of ethylene oxide, and in some examples an average (arithmetic mean) degree of ethoxylation of 1.8 mols of ethylene oxide. In further examples, the alkyl ether sulfate surfactant may have a carbon chain length between about 10 carbon atoms to about 18 carbon atoms, and a degree of ethoxylation of from about 1 to about 6 mols of ethylene oxide. In yet further examples, the alkyl ether sulfate surfactant may contain a peaked ethoxylate distribution.

Non-alkoxylated alkyl sulfates may also be added to the disclosed detergent compositions and used as an anionic surfactant component. Examples of non-alkoxylated, e.g., non-ethoxylated, alkyl sulfate surfactants include those produced by the sulfation of higher $C_8$-$C_{20}$ fatty alcohols. In some examples, primary alkyl sulfate surfactants have the general formula: $ROSO_3^- M^+$, wherein R is typically a linear $C_8$-$C_{20}$ hydrocarbyl group, which may be straight chain or branched chain, and M is a water-solubilizing cation. In some examples, R is a $C_{10}$-$C_{18}$ alkyl, and M is an alkali metal. In other examples, R is a $C_{12}/C_{14}$ alkyl and M is sodium, such as those derived from natural alcohols.

Other useful anionic surfactants can include the alkali metal salts of alkyl benzene sulfonates, in which the alkyl group contains from about 9 to about 15 carbon atoms, in straight chain (linear) or branched chain configuration. In some examples, the alkyl group is linear. Such linear alkylbenzene sulfonates are known as "LAS." In other examples, the linear alkylbenzene sulfonate may have an average number of carbon atoms in the alkyl group of from about 11 to 14. In a specific example, the linear straight chain alkyl benzene sulfonates may have an average number of carbon atoms in the alkyl group of about 11.8 carbon atoms, which may be abbreviated as C11.8 LAS.

Suitable alkyl benzene sulphonate (LAS) may be obtained, by sulphonating commercially available linear alkyl benzene (LAB); suitable LAB includes low 2-phenyl LAB, such as those supplied by Sasol under the tradename Isochem® or those supplied by Petresa under the tradename Petrelab®, other suitable LAB include high 2-phenyl LAB, such as those supplied by Sasol under the tradename Hyblene®. A suitable anionic detersive surfactant is alkyl benzene sulphonate that is obtained by DETAL catalyzed process, although other synthesis routes, such as HF, may also be suitable. In one aspect a magnesium salt of LAS is used.

Another example of a suitable alkyl benzene sulfonate is a modified LAS (MLAS), which is a positional isomer that contains a branch, e.g., a methyl branch, where the aromatic ring is attached to the 2 or 3 position of the alkyl chain.

The anionic surfactant may include a 2-alkyl branched primary alkyl sulfates have 100% branching at the C2 position (C1 is the carbon atom covalently attached to the alkoxylated sulfate moiety). 2-alkyl branched alkyl sulfates and 2-alkyl branched alkyl alkoxy sulfates are generally derived from 2-alkyl branched alcohols (as hydrophobes). 2-alkyl branched alcohols, e.g., 2-alkyl-1-alkanols or 2-alkyl primary alcohols, which are derived from the oxo process, are commercially available from Sasol, e.g., LIAL®, ISALCHEM® (which is prepared from LIAL® alcohols by a fractionation process). C14/C15 branched primary alkyl sulfate are also commercially available, e.g., namely LIAL® 145 sulfate.

The anionic surfactant may include a mid-chain branched anionic surfactant, e.g., a mid-chain branched anionic detersive surfactant, such as, a mid-chain branched alkyl sulphate and/or a mid-chain branched alkyl benzene sulphonate.

Additional suitable anionic surfactants include methyl ester sulfonates, paraffin sulfonates, α-olefin sulfonates, and internal olefin sulfonates.

The compositions disclosed herein may comprise an anionic surfactant selected from the group consisting of linear or branched alkyl benzene sulfonates, linear or branched alkoxylated alkyl sulfates, linear or branched alkyl sulfates, methyl ester sulfonates, paraffin sulfonates, α-olefin olefin sulfonates, internal olefin sulfonates, and mixtures thereof. The compositions disclosed herein may comprise an anionic surfactant selected from the group consisting of linear or branched alkyl benzene sulfonates, linear or branched alkoxylated alkyl sulfates, linear or branched alkyl sulfates, and mixtures thereof. The compositions disclosed herein may comprise a 2-alkyl branched primary alkyl sulfate.

Nonionic Surfactant

The compositions disclosed herein may comprise a nonionic surfactant. Suitable nonionic surfactants include alkoxylated fatty alcohols. The nonionic surfactant may be selected from ethoxylated alcohols and ethoxylated alkyl phenols of the formula $R(OC_2H_4)_nOH$, wherein R is selected from the group consisting of aliphatic hydrocarbon radicals containing from about 8 to about 15 carbon atoms and alkyl phenyl radicals in which the alkyl groups contain from about 8 to about 12 carbon atoms, and the average value of n is from about 5 to about 15.

Other non-limiting examples of nonionic surfactants useful herein include: $C_8$-$C_{18}$ alkyl ethoxylates, such as, NEODOL® nonionic surfactants from Shell; $C_6$-$C_{12}$ alkyl phenol alkoxylates where the alkoxylate units may be ethyleneoxy units, propyleneoxy units, or a mixture thereof; $C_{12}$-$C_{18}$ alcohol and $C_6$-$C_{12}$ alkyl phenol condensates with ethylene oxide/propylene oxide block polymers such as Pluronic® from BASF; $C_{14}$-$C_{22}$ mid-chain branched alcohols, BA; $C_{14}$-$C_{22}$ mid-chain branched alkyl alkoxylates, $BAE_x$, wherein x is from 1 to 30; alkylpolysaccharides; specifically alkylpolyglycosides; polyhydroxy fatty acid amides; and ether capped poly(oxyalkylated) alcohol surfactants.

Suitable nonionic detersive surfactants also include alkyl polyglucoside and alkyl alkoxylated alcohol. Suitable nonionic surfactants also include those sold under the tradename Lutensol® from BASF.

Cationic Surfactant

The compositions disclosed herein may comprise a cationic surfactant. Non-limiting examples of cationic surfactants include: the quaternary ammonium surfactants, which can have up to 26 carbon atoms include: alkoxylate quaternary ammonium (AQA) surfactants; dimethyl hydroxyethyl quaternary ammonium; dimethyl hydroxyethyl lauryl ammonium chloride; polyamine cationic surfactants; cationic ester surfactants; and amino surfactants, e.g., amido propyldimethyl amine (APA).

Suitable cationic detersive surfactants also include alkyl pyridinium compounds, alkyl quaternary ammonium compounds, alkyl quaternary phosphonium compounds, alkyl ternary sulphonium compounds, and mixtures thereof.

Suitable cationic detersive surfactants are quaternary ammonium compounds having the general formula:

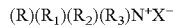

$$(R)(R_1)(R_2)(R_3)N^+X^-$$

wherein, R is a linear or branched, substituted or unsubstituted $C_{6-18}$ alkyl or alkenyl moiety, $R_1$ and $R_2$ are independently selected from methyl or ethyl moieties, $R_3$ is a hydroxyl, hydroxymethyl or a hydroxyethyl moiety, X is an anion which provides charge neutrality, suitable anions include: halides, for example chloride; sulphate; and sulphonate. Suitable cationic detersive surfactants are mono-$C_{6-18}$ alkyl mono-hydroxyethyl di-methyl quaternary ammonium chlorides. Highly suitable cationic detersive surfactants are mono-$C_{8-10}$ alkyl mono-hydroxyethyl di-methyl quaternary ammonium chloride, mono-$C_{10-12}$ alkyl mono-hydroxyethyl di-methyl quaternary ammonium chloride and mono-$C_{10}$ alkyl mono-hydroxyethyl di-methyl quaternary ammonium chloride.

Zwitterionic Surfactant

The compositions disclosed herein may comprise a zwitterionic surfactant. Examples of zwitterionic surfactants include: derivatives of secondary and tertiary amines, derivatives of heterocyclic secondary and tertiary amines, or derivatives of quaternary ammonium, quaternary phosphonium or tertiary sulfonium compounds. Suitable examples of zwitterionic surfactants include betaines, including alkyl dimethyl betaine and cocodimethyl amidopropyl betaine, $C_8$ to $C_{18}$ (for example from $C_{12}$ to $C_{18}$) amine oxides, and sulfo and hydroxy betaines, such as N-alkyl-N,N-dimethylammino-1-propane sulfonate where the alkyl group can be $C_8$ to $C_{18}$.

Amphoteric Surfactant

The compositions disclosed herein may comprise an amphoteric surfactant. Examples of amphoteric surfactants include aliphatic derivatives of secondary or tertiary amines, or aliphatic derivatives of heterocyclic secondary and tertiary amines in which the aliphatic radical may be straight or branched-chain and where one of the aliphatic substituents contains at least about 8 carbon atoms, or from about 8 to about 18 carbon atoms, and at least one of the aliphatic substituents contains an anionic water-solubilizing group, e.g. carboxy, sulfonate, sulfate. Suitable amphoteric surfactants also include sarcosinates, glycinates, taurinates, and mixtures thereof.

Adjuncts

The compositions disclosed herein, particularly the dilute and compacted fluid detergents that are suitable for sale to consumers (final products), may comprise adjunct ingredients. The compositions disclosed herein may comprise an adjunct selected from the group consisting of a structurant, a builder, an organic polymeric compound, an enzyme, an enzyme stabilizer, a bleach system, a brightener, a hueing agent, a chelating agent, a suds suppressor, a conditioning agent, a humectant, a perfume, a perfume microcapsule, a filler or carrier, an alkalinity system, a pH control system, a buffer, an alkanolamine, and mixtures thereof.

Enzymes

The compositions described herein may comprise one or more enzymes which provide cleaning performance and/or fabric care benefits. Examples of suitable enzymes include, but are not limited to, hemicellulases, peroxidases, proteases, cellulases, xylanases, lipases, phospholipases, esterases, cutinases, pectinases, mannanases, pectate lyases, keratinases, reductases, oxidases, phenoloxidases, lipoxygenases, ligninases, pullulanases, tannases, pentosanases, malanases, ß-glucanases, arabinosidases, hyaluronidase, chondroitinase, laccase, and amylases, or mixtures thereof. A typical combination is an enzyme cocktail that may comprise, for example, a protease and lipase in conjunction with amylase. When present in a detergent composition, the aforementioned additional enzymes may be present at levels from about 0.00001% to about 2%, from about 0.0001% to about 1% or even from about 0.001% to about 0.5% enzyme protein by weight of the composition. The compositions disclosed herein may comprise from about 0.001% to about 1% by weight of an enzyme (as an adjunct), which may be selected from the group consisting of lipase, amylase, protease, mannanase, cellulase, pectinase, and mixtures thereof.

Enzyme Stabilizing System

The compositions may optionally comprise from about 0.001% to about 10%, or from about 0.005% to about 8%, or from about 0.01% to about 6%, by weight of the composition, of an enzyme stabilizing system. The enzyme stabilizing system can be any stabilizing system which is compatible with the detersive enzyme. Such a system may be inherently provided by other formulation actives, or be added separately, e.g., by the formulator or by a manufacturer of detergent-ready enzymes. Such stabilizing systems can, for example, comprise calcium ion, boric acid, propylene glycol, short chain carboxylic acids, boronic acids, chlorine bleach scavengers and mixtures thereof, and are designed to address different stabilization problems depending on the type and physical form of the detergent composition. In the case of aqueous detergent compositions comprising protease, a reversible protease inhibitor, such as a boron compound, including borate, 4-formyl phenylboronic acid, phenylboronic acid and derivatives thereof, or compounds such as calcium formate, sodium formate and 1,2-propane diol may be added to further improve stability.

Builders

The compositions may comprise a builder. Built compositions typically comprise at least about 1% builder, based on the total weight of the composition. Liquid detergent compositions may comprise up to about 10% builder, and in some examples up to about 8% builder, of the total weight of the composition.

Suitable builders include aluminosilicates (e.g., zeolite builders, such as zeolite A, zeolite P, and zeolite MAP), silicates, phosphates, such as polyphosphates (e.g., sodium tri-polyphosphate), especially sodium salts thereof; carbonates, bicarbonates, sesquicarbonates, and carbonate minerals other than sodium carbonate or sesquicarbonate; organic mono-, di-, tri-, and tetracarboxylates, especially water-soluble nonsurfactant carboxylates in acid, sodium, potassium or alkanolammonium salt form, as well as oligomeric or water-soluble low molecular weight polymer carboxylates including aliphatic and aromatic types; and phytic acid. Additional suitable builders may be selected from citric acid, lactic acid, fatty acid, polycarboxylate builders, for example, copolymers of acrylic acid, copolymers of acrylic acid and maleic acid, and copolymers of acrylic acid and/or maleic acid, and other suitable ethylenic monomers with various types of additional functionalities. Alternatively, the composition may be substantially free of builder.

Structurant/Thickeners

Suitable structurants/thickeners include di-benzylidene polyol acetal derivative. The fluid detergent composition may comprise from about 0.01% to about 1% by weight of a dibenzylidene polyol acetal derivative (DBPA), or from about 0.05% to about 0.8%, or from about 0.1% to about 0.6%, or even from about 0.3% to about 0.5%. The DBPA derivative may comprise a dibenzylidene sorbitol acetal derivative (DBS).

Suitable structurants/thickeners also include bacterial cellulose. The fluid detergent composition may comprise from about 0.005% to about 1% by weight of a bacterial cellulose network. The term "bacterial cellulose" encompasses any type of cellulose produced via fermentation of a bacteria of the genus Acetobacter such as CELLULON® by CPKelco U.S. and includes materials referred to popularly as microfibrillated cellulose, reticulated bacterial cellulose, and the like.

Suitable structurants/thickeners also include coated bacterial cellulose. The bacterial cellulose may be at least partially coated with a polymeric thickener. The at least partially coated bacterial cellulose may comprise from about 0.1% to about 5%, or even from about 0.5% to about 3%, by weight of bacterial cellulose; and from about 10% to about 90% by weight of the polymeric thickener. Suitable bacterial cellulose may include the bacterial cellulose described above and suitable polymeric thickeners include: carboxymethylcellulose, cationic hydroxymethylcellulose, and mixtures thereof.

Suitable structurants/thickeners also include cellulose fibers. The composition may comprise from about 0.01 to about 5% by weight of the composition of a cellulosic fiber. The cellulosic fiber may be extracted from vegetables, fruits or wood. Commercially available examples are Avicel® from FMC, Citri-Fi from Fiberstar or Betafib from Cosun.

Suitable structurants/thickeners also include non-polymeric crystalline hydroxyl-functional materials. The composition may comprise from about 0.01 to about 1% by weight of the composition of a non-polymeric crystalline, hydroxyl functional structurant. The non-polymeric crystalline, hydroxyl functional structurants generally may comprise a crystallizable glyceride which can be pre-emulsified to aid dispersion into the final fluid detergent composition. The crystallizable glycerides may include hydrogenated castor oil or "HCO" or derivatives thereof, provided that it is capable of crystallizing in the liquid detergent composition.

Suitable structurants/thickeners also include polymeric structuring agents. The compositions may comprise from about 0.01% to about 5% by weight of a naturally derived and/or synthetic polymeric structurant. Examples of naturally derived polymeric structurants of use in the present invention include: hydroxyethyl cellulose, hydrophobically modified hydroxyethyl cellulose, carboxymethyl cellulose, polysaccharide derivatives and mixtures thereof. Suitable polysaccharide derivatives include: pectine, alginate, arabinogalactan (gum Arabic), carrageenan, gellan gum, xanthan gum, guar gum and mixtures thereof. Examples of synthetic polymeric structurants of use in the present invention include: polycarboxylates, polyacrylates, hydrophobically modified ethoxylated urethanes, hydrophobically modified non-ionic polyols and mixtures thereof.

Suitable structurants/thickeners also include di-amido-gellants. The external structuring system may comprise a di-amido gellant having a molecular weight from about 150 g/mol to about 1,500 g/mol, or even from about 500 g/mol to about 900 g/mol. Such di-amido gellants may comprise at least two nitrogen atoms, wherein at least two of said nitrogen atoms form amido functional substitution groups. The amido groups may be different or the same. Non-limiting examples of di-amido gellants are: N,N'-(2S,2'S)-1,1'-(dodecane-1,12-diylbis(azanediyl))bis(3-methyl-1-oxobutane-2,1-diyl)diisonicotinamide; dibenzyl (2S,2'S)-1,1'-(propane-1,3-diylbis(azanediyl))bis(3-methyl-1-oxobutane-2,1-diyl)dicarbamate; dibenzyl (2S,2'S)-1,1'-(dodecane1,12-diylbis(azanediyl))bis(1-oxo-3-phenylpropane-2,1-diyl)dicarbamate.

Polymeric Dispersing Agents

The cleaning composition may comprise one or more polymeric dispersing agents. Examples are carboxymethylcellulose, poly(vinyl-pyrrolidone), poly (ethylene glycol), poly(vinyl alcohol), poly(vinylpyridine-N-oxide), poly(vinylimidazole), polycarboxylates such as polyacrylates, maleic/acrylic acid copolymers and lauryl methacrylate/acrylic acid co-polymers.

The cleaning composition may comprise one or more amphiphilic cleaning polymers such as the compound having the following general structure: $bis((C_2H_5O)(C_2H_4O)n)(CH_3)-N^+-C_xH_{2x}-N^+-(CH_3)-bis((C_2H_5O)(C_2H_4O)n)$, wherein n=from 20 to 30, and x=from 3 to 8, or sulphated or sulphonated variants thereof.

The cleaning composition may comprise amphiphilic alkoxylated grease cleaning polymers which have balanced hydrophilic and hydrophobic properties such that they remove grease particles from fabrics and surfaces. The amphiphilic alkoxylated grease cleaning polymers may comprise a core structure and a plurality of alkoxylate groups attached to that core structure. These may comprise alkoxylated polyalkylenimines, for example, having an inner polyethylene oxide block and an outer polypropylene oxide block. Such compounds may include, but are not limited to, ethoxylated polyethyleneimine, ethoxylated hexamethylene diamine, and sulfated versions thereof. Polypropoxylated derivatives may also be included. A wide variety of amines and polyalklyeneimines can be alkoxylated to various degrees. A useful example is 600 g/mol polyethyleneimine core ethoxylated to 20 EO groups per NH and is available from BASF. The detergent compositions described herein may comprise from about 0.1% to about 10%, and in some examples, from about 0.1% to about 8%, and in other examples, from about 0.1% to about 6%, by weight of the detergent composition, of alkoxylated polyamines.

Carboxylate polymer—The detergent composition may also include one or more carboxylate polymers, which may optionally be sulfonated. Suitable carboxylate polymers include a maleate/acrylate random copolymer or a poly (meth)acrylate homopolymer. In one aspect, the carboxylate polymer is a poly(meth)acrylate homopolymer having a molecular weight from 4,000 Da to 9,000 Da, or from 6,000 Da to 9,000 Da.

Alkoxylated polycarboxylates may also be used in the detergent compositions herein to provide grease removal. Such materials are described in WO 91/08281 and PCT 90/01815. Chemically, these materials comprise poly(meth)acrylates having one ethoxy side-chain per every 7-8 (meth)acrylate units. The side-chains are of the formula $-(CH_2CH_2O)_m(CH_2)_nCH_3$ wherein m is 2-3 and n is 6-12. The side-chains are ester-linked to the polyacrylate "backbone" to provide a "comb" polymer type structure. The molecular weight can vary, but may be in the range of about 2000 to about 50,000. The detergent compositions described herein may comprise from about 0.1% to about 10%, and in some examples, from about 0.25% to about 5%, and in other examples, from about 0.3% to about 2%, by weight of the detergent composition, of alkoxylated polycarboxylates.

The compositions may include an amphiphilic graft co-polymer. A suitable amphiphilic graft co-polymer comprises (i) a polyethyelene glycol backbone; and (ii) and at least one pendant moiety selected from polyvinyl acetate, polyvinyl alcohol and mixtures thereof. A suitable amphilic graft co-polymer is Sokalan® HP22, supplied from BASF. Suitable polymers include random graft copolymers, preferably a polyvinyl acetate grafted polyethylene oxide copolymer having a polyethylene oxide backbone and multiple polyvinyl acetate side chains. The molecular weight of the polyethylene oxide backbone is typically about 6000 and the weight ratio of the polyethylene oxide to polyvinyl acetate is about 40 to 60 and no more than 1 grafting point per 50 ethylene oxide units.

Soil Release Polymer

The detergent compositions of the present invention may also include one or more soil release polymers having a structure as defined by one of the following structures (I), (II) or (III):

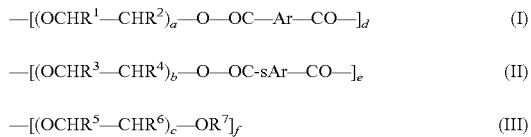

$$—[(OCHR^1—CHR^2)_a—O—OC—Ar—CO—]_d \quad (I)$$

$$—[(OCHR^3—CHR^4)_b—O—OC\text{-}sAr—CO—]_e \quad (II)$$

$$—[(OCHR^5—CHR^6)_c—OR^7]_f \quad (III)$$

wherein:

a, b and c are from 1 to 200;

d, e and f are from 1 to 50;

Ar is a 1,4-substituted phenylene;

sAr is 1,3-substituted phenylene substituted in position 5 with $SO_3Me$;

Me is Li, K, Mg/2, Ca/2, Al/3, ammonium, mono-, di-, tri-, or tetraalkylammonium wherein the alkyl groups are $C_1$-$C_{18}$ alkyl or $C2$-$C_{10}$ hydroxyalkyl, or mixtures thereof;

$R^1, R^2, R^3, R^4, R^5$ and $R^6$ are independently selected from H or $C_1$-$C_{18}$ n— or iso-alkyl; and $R_7$ is a linear or branched $C_1$-$C_{18}$ alkyl, or a linear or branched $C_2$-$C_{30}$ alkenyl, or a cycloalkyl group with 5 to 9 carbon atoms, or a $C_8$-$C_{30}$ aryl group, or a $C_6$-$C_{30}$ arylalkyl group.

Suitable soil release polymers are polyester soil release polymers such as Repel-o-tex polymers, including Repel-o-tex SF, SF-2 and SRP6 supplied by Rhodia. Other suitable soil release polymers include Texcare polymers, including Texcare SRA100, SRA300, SRN100, SRN170, SRN240, SRN300 and SRN325 supplied by Clariant. Other suitable soil release polymers are Marloquest polymers, such as Marloquest SL supplied by Sasol.

Cellulosic Polymer

The cleaning compositions of the present invention may also include one or more cellulosic polymers including those selected from alkyl cellulose, alkyl alkoxyalkyl cellulose, carboxyalkyl cellulose, alkyl carboxyalkyl cellulose. In one aspect, the cellulosic polymers are selected from the group comprising carboxymethyl cellulose, methyl cellulose, methyl hydroxyethyl cellulose, methyl carboxymethyl cellulose, and mixures thereof. In one aspect, the carboxymethyl cellulose has a degree of carboxymethyl substitution from 0.5 to 0.9 and a molecular weight from 100,000 Da to 300,000 Da.

Amines

Additional amines may be used in the compositions described herein for added removal of grease and particulates from soiled materials. The compositions described herein may comprise from about 0.1% to about 10%, or from about 0.1% to about 4%, or from about 0.1% to about 2%, by weight of the composition, of additional amines Non-limiting examples of additional amines include, but are not limited to, polyetheramines, polyamines, oligoamines, triamines, diamines, pentamines, tetraamines, or combinations thereof. Specific examples of suitable additional amines include tetraethylenepentamine, triethylenetetraamine, diethylenetriamine, or a mixture thereof.

Bleaching Agents

The detergent compositions of the present invention may comprise one or more bleaching agents. Suitable bleaching agents other than bleaching catalysts include photobleaches, bleach activators, hydrogen peroxide, sources of hydrogen peroxide, pre-formed peracids and mixtures thereof. In general, when a bleaching agent is used, the detergent compositions of the present invention may comprise from about 0.1% to about 50% or even from about 0.1% to about 25% bleaching agent by weight of the detergent composition.

Bleach Catalysts

The detergent compositions of the present invention may also include one or more bleach catalysts capable of accepting an oxygen atom from a peroxyacid and/or salt thereof, and transferring the oxygen atom to an oxidizeable substrate. Suitable bleach catalysts include, but are not limited to: iminium cations and polyions; iminium zwitterions; modified amines; modified amine oxides; N-sulphonyl imines; N-phosphonyl imines; N-acyl imines; thiadiazole dioxides; perfluoroimines; cyclic sugar ketones and mixtures thereof.

Brighteners

Optical brighteners or other brightening or whitening agents may be incorporated at levels of from about 0.01% to about 1.2%, by weight of the composition, into the detergent compositions described herein. Commercial fluorescent brighteners suitable for the present invention can be classified into subgroups, including but not limited to: derivatives of stilbene, pyrazoline, coumarin, benzoxazoles, carboxylic acid, methinecyanines, dibenzothiophene-5,5-dioxide, azoles, 5- and 6-membered-ring heterocycles, and other miscellaneous agents.

In some examples, the fluorescent brightener is selected from the group consisting of disodium 4,4'-bis{[4-anilino-6-morpholino-s-triazin-2-yl]-amino}-2,2'-stilbenedisulfonate (brightener 15, commercially available under the tradename Tinopal AMS-GX by Ciba Geigy Corporation), disodium4,4'-bis{[4-anilino-6-(N-2-bis-hydroxyethyl)-s-triazine-2-yl]-amino}-2,2'-stilbenedisulonate (commercially available under the tradename Tinopal UNPA-GX by Ciba-Geigy Corporation), disodium 4,4'-bis{[4-anilino-6-(N-2-hydroxyethyl-N-methylamino)-s-triazine-2-yl]-amino}-2, 2'-stilbenedisulfonate (commercially available under the tradename Tinopal 5BM-GX by Ciba-Geigy Corporation). More preferably, the fluorescent brightener is disodium 4,4'-bis{[4-anilino-6-morpholino-s-triazin-2-yl]-amino}-2, 2'-stilbenedisulfonate.

The brighteners may be added in particulate form or as a premix with a suitable solvent, for example nonionic surfactant, propanediol.

Fabric Hueing Agents

The composition may comprise a fabric hueing agent (sometimes referred to as shading, bluing or whitening agents). Typically the hueing agent provides a blue or violet shade to fabric. Hueing agents can be used either alone or in combination to create a specific shade of hueing and/or to shade different fabric types. This may be provided for example by mixing a red and green-blue dye to yield a blue or violet shade. Hueing agents may be selected from any known chemical class of dye, including but not limited to acridine, anthraquinone (including polycyclic quinones), azine, azo (e.g., monoazo, disazo, trisazo, tetrakisazo, polyazo), including premetallized azo, benzodifurane and benzodifuranone, carotenoid, coumarin, cyanine, diazahemicyanine, diphenylmethane, formazan, hemicyanine, indigoids, methane, naphthalimides, naphthoquinone, nitro and nitroso, oxazine, phthalocyanine, pyrazoles, stilbene, styryl, triarylmethane, triphenylmethane, xanthenes and mixtures thereof.

Suitable fabric hueing agents include dyes, dye-clay conjugates, and organic and inorganic pigments. Suitable dyes also include small molecule dyes and polymeric dyes. Suitable small molecule dyes include small molecule dyes selected from the group consisting of dyes falling into the Colour Index (C.I.) classifications of Direct, Basic, Reactive or hydrolysed Reactive, Solvent or Disperse dyes for example that are classified as Blue, Violet, Red, Green or Black, and provide the desired shade either alone or in combination. Suitable polymeric dyes include polymeric dyes selected from the group consisting of polymers containing covalently bound (sometimes referred to as conjugated) chromogens, (dye-polymer conjugates), for example polymers with chromogens co-polymerized into the backbone of the polymer and mixtures thereof. Suitable polymeric dyes also include polymeric dyes selected from the group consisting of fabric-substantive colorants sold under the name of Liquitint® (Milliken, Spartanburg, S.C., USA), dye-polymer conjugates formed from at least one reactive dye and a polymer selected from the group consisting of polymers comprising a moiety selected from the group consisting of a hydroxyl moiety, a primary amine moiety, a secondary amine moiety, a thiol moiety and mixtures thereof. Suitable polymeric dyes also include polymeric dyes selected from the group consisting of Liquitint® Violet Conn., carboxymethyl cellulose (CMC) covalently bound to a reactive blue, reactive violet or reactive red dye such as CMC conjugated with C.I. Reactive Blue 19, sold by Megazyme, Wicklow, Ireland under the product name AZO-CM-CELLULOSE, product code S-ACMC, alkoxylated triphenyl-methane polymeric colourants, alkoxylated thiophene polymeric colourants, and mixtures thereof.

The aforementioned fabric hueing agents can be used in combination (any mixture of fabric hueing agents can be used).

Encapsulates

The compositions may comprise an encapsulate. The encapsulate may comprise a core, a shell having an inner and outer surface, where the shell encapsulates the core.

The encapsulate may comprise a core and a shell, where the core comprises a material selected from perfumes; brighteners; dyes; insect repellants; silicones; waxes; flavors; vitamins; fabric softening agents; skin care agents, e.g., paraffins; enzymes; anti-bacterial agents; bleaches; sensates; or mixtures thereof; and where the shell comprises a material selected from polyethylenes; polyamides; polyvinyl alcohols, optionally containing other co-monomers; polystyrenes; polyisoprenes; polycarbonates; polyesters; polyacrylates; polyolefins; polysaccharides, e.g., alginate and/or chitosan; gelatin; shellac; epoxy resins; vinyl polymers; water insoluble inorganics; silicone; aminoplasts, or mixtures thereof. When the shell comprises an aminoplast, the aminoplast may comprise polyurea, polyurethane, and/or polyureaurethane. The polyurea may comprise polyoxymethyleneurea and/or melamine formaldehyde.

The encapsulate may comprise a core, and the core may comprise a perfume. The encapsulate may comprise a shell, and the shell may comprise melamine formaldehyde and/or cross linked melamine formaldehyde. The encapsulate may comprise a core comprising a perfume and a shell comprising melamine formaldehyde and/or cross linked melamine formaldehyde Suitable encapsulates may comprise a core material and a shell, where the shell at least partially surrounds the core material. The core of the encapsulate comprises a material selected from a perfume raw material and/or optionally another material, e.g., vegetable oil, esters of vegetable oils, esters, straight or branched chain hydrocarbons, partially hydrogenated terphenyls, dialkyl phthalates, alkyl biphenyls, alkylated naphthalene, petroleum spirits, aromatic solvents, silicone oils, or mixtures thereof.

The wall of the encapsulate may comprise a suitable resin, such as the reaction product of an aldehyde and an amine. Suitable aldehydes include formaldehyde. Suitable amines include melamine, urea, benzoguanamine, glycoluril, or mixtures thereof. Suitable melamines include methylol melamine, methylated methylol melamine, imino melamine and mixtures thereof.

Suitable ureas include, dimethylol urea, methylated dimethylol urea, urea-resorcinol, or mixtures thereof.

Suitable formaldehyde scavengers may be employed with the encapsulates, for example, in a capsule slurry and/or added to a composition before, during, or after the encapsulates are added to such composition.

Suitable capsules can be purchased from Appleton Papers Inc. of Appleton, Wis. USA.

Perfumes

Perfumes and perfumery ingredients may be used in the detergent compositions described herein. Non-limiting examples of perfume and perfumery ingredients include, but are not limited to, aldehydes, ketones, esters, and the like. Other examples include various natural extracts and essences which can comprise complex mixtures of ingredients, such as orange oil, lemon oil, rose extract, lavender, musk, patchouli, balsamic essence, sandalwood oil, pine oil, cedar, and the like. Finished perfumes can comprise extremely complex mixtures of such ingredients. Finished perfumes may be included at a concentration ranging from about 0.01% to about 2% by weight of the detergent composition.

Dye Transfer Inhibiting Agents

Fabric detergent compositions may also include one or more materials effective for inhibiting the transfer of dyes from one fabric to another during the cleaning process. Generally, such dye transfer inhibiting agents may include polyvinyl pyrrolidone polymers, polyamine N-oxide polymers, copolymers of N-vinylpyrrolidone and N-vinylimidazole, manganese phthalocyanine, peroxidases, and mixtures thereof. If used, these agents may be used at a concentration of about 0.0001% to about 10%, by weight of the composition, in some examples, from about 0.01% to about 5%, by weight of the composition, and in other examples, from about 0.05% to about 2% by weight of the composition.

Chelating Agents

The detergent compositions described herein may also contain one or more metal ion chelating agents. Suitable molecules include copper, iron and/or manganese chelating agents and mixtures thereof. Such chelating agents can be selected from the group consisting of phosphonates, amino carboxylates, amino phosphonates, succinates, polyfunctionally-substituted aromatic chelating agents, 2-pyridinol-N-oxide compounds, hydroxamic acids, carboxymethyl inulins and mixtures thereof. Chelating agents can be present in the acid or salt form including alkali metal, ammonium, and substituted ammonium salts thereof, and mixtures thereof. Other suitable chelating agents for use herein are the commercial DEQUEST series, and chelants from Monsanto, Akzo-Nobel, DuPont, Dow, the Trilon® series from BASF and Nalco.

The chelant may be present in the detergent compositions disclosed herein at from about 0.005% to about 15% by weight, about 0.01% to about 5% by weight, about 0.1% to about 3.0% by weight, or from about 0.2% to about 0.7% by weight, or from about 0.3% to about 0.6% by weight of the detergent compositions disclosed herein.

Suds Suppressors

Compounds for reducing or suppressing the formation of suds can be incorporated into the detergent compositions described herein. Suds suppression can be of particular importance in the so-called "high concentration cleaning process" and in front-loading style washing machines. The detergent compositions herein may comprise from 0.1% to about 10%, by weight of the composition, of suds suppressor.

Examples of suds supressors include monocarboxylic fatty acid and soluble salts therein, high molecular weight hydrocarbons such as paraffin, fatty acid esters (e.g., fatty acid triglycerides), fatty acid esters of monovalent alcohols, aliphatic $C_{18}$-$C_{40}$ ketones (e.g., stearone), N-alkylated amino triazines, waxy hydrocarbons preferably having a melting point below about 100° C., silicone suds suppressors, and secondary alcohols.

Additional suitable antifoams are those derived from phenylpropylmethyl substituted polysiloxanes.

The detergent composition may comprise a suds suppressor selected from organomodified silicone polymers with aryl or alkylaryl substituents combined with silicone resin and a primary filler, which is modified silica. The detergent compositions may comprise from about 0.001% to about 4.0%, by weight of the composition, of such a suds suppressor.

The detergent composition comprises a suds suppressor selected from: a) mixtures of from about 80 to about 92% ethylmethyl, methyl(2-phenylpropyl) siloxane; from about 5 to about 14% MQ resin in octyl stearate; and from about 3 to about 7% modified silica; b) mixtures of from about 78 to about 92% ethylmethyl, methyl(2-phenylpropyl) siloxane; from about 3 to about 10% MQ resin in octyl stearate; from about 4 to about 12% modified silica; or c) mixtures thereof, where the percentages are by weight of the anti-foam.

Suds Boosters

If high sudsing is desired, suds boosters such as the $C_{10}$-$C_{16}$ alkanolamides may be incorporated into the detergent compositions at a concentration ranging from about 1% to about 10% by weight of the detergent composition. Some examples include the $C_{10}$-$C_{14}$ monoethanol and diethanol amides. If desired, water-soluble magnesium and/or calcium salts such as $MgCl_2$, $MgSO_4$, $CaCl_2$, $CaSO_4$, and the like, may be added at levels of about 0.1% to about 2% by weight of the detergent composition, to provide additional suds and to enhance grease removal performance.

Conditioning Agents

The composition of the present invention may include a high melting point fatty compound. The high melting point fatty compound useful herein has a melting point of 25° C. or higher, and is selected from the group consisting of fatty alcohols, fatty acids, fatty alcohol derivatives, fatty acid derivatives, and mixtures thereof. Such compounds of low melting point are not intended to be included in this section.

The high melting point fatty compound is included in the composition at a level of from about 0.1% to about 40%, preferably from about 1% to about 30%, more preferably from about 1.5% to about 16% by weight of the composition, from about 1.5% to about 8%. The composition of the present invention may include a nonionic polymer as a conditioning agent.

Suitable conditioning agents for use in the composition include those conditioning agents characterized generally as silicones (e.g., silicone oils, cationic silicones, silicone gums, high refractive silicones, and silicone resins), organic conditioning oils (e.g., hydrocarbon oils, polyolefins, and fatty esters) or combinations thereof, or those conditioning agents which otherwise form liquid, dispersed particles in the aqueous surfactant matrix herein. The concentration of the silicone conditioning agent typically ranges from about 0.01% to about 10%.

The compositions of the present invention may also comprise from about 0.05% to about 3% of at least one organic conditioning oil as the conditioning agent, either alone or in combination with other conditioning agents, such as the silicones (described herein). Suitable conditioning oils include hydrocarbon oils, polyolefins, and fatty esters.

Fabric Enhancement Polymers

Suitable fabric enhancement polymers are typically cationically charged and/or have a high molecular weight. Suitable concentrations of this component are in the range from 0.01% to 50%, preferably from 0.1% to 15%, more preferably from 0.2% to 5.0%, and most preferably from 0.5% to 3.0% by weight of the composition. The fabric enhancement polymers may be a homopolymer or be formed from two or more types of monomers. The monomer weight of the polymer will generally be between 5,000 and 10,000, 000, typically at least 10,000 and preferably in the range 100,000 to 2,000,000. Preferred fabric enhancement polymers will have cationic charge densities of at least 0.2 meq/gm, preferably at least 0.25 meq/gm, more preferably at least 0.3 meq/gm, but also preferably less than 5 meq/gm, more preferably less than 3 meq/gm, and most preferably less than 2 meq/gm at the pH of intended use of the composition, which pH will generally range from pH 3 to pH 9, preferably between pH 4 and pH 8. The fabric enhancement polymers may be of natural or synthetic origin.

Pearlescent Agent

The laundry detergent compositions of the invention may comprise a pearlescent agent. Non-limiting examples of pearlescent agents include: mica; titanium dioxide coated mica; bismuth oxychloride; fish scales; mono and diesters of alkylene glycol. The pearlescent agent may be ethyleneglycoldistearate (EGDS).

Hygiene and Malodour

The compositions of the present invention may also comprise one or more of zinc ricinoleate, thymol, quaternary ammonium salts such as Bardac®, polyethylenimines (such as Lupasol® from BASF) and zinc complexes thereof, silver and silver compounds, especially those designed to slowly release $Ag^+$ or nano-silver dispersions.

Buffer System

The detergent compositions described herein may be formulated such that, during use in aqueous cleaning operations, the wash water will have a pH of between about 7.0 and about 12, and in some examples, between about 7.0 and about 11. Techniques for controlling pH at recommended usage levels include the use of buffers, alkalis, or acids, and are well known to those skilled in the art. These include, but are not limited to, the use of sodium carbonate, citric acid or sodium citrate, lactic acid or lactate, monoethanol amine or other amines, boric acid or borates, and other pH-adjusting compounds well known in the art.

The detergent compositions herein may comprise dynamic in-wash pH profiles. Such detergent compositions may use wax-covered citric acid particles in conjunction with other pH control agents such that (i) about 3 minutes after contact with water, the pH of the wash liquor is greater than 10; (ii) about 10 minutes after contact with water, the pH of the wash liquor is less than 9.5; (iii) about 20 minutes after contact with water, the pH of the wash liquor is less than 9.0; and (iv) optionally, wherein, the equilibrium pH of the wash liquor is in the range of from about 7.0 to about 8.5.

Water-Soluble Film

The compositions of the present disclosure may be encapsulated within a water-soluble film, for example, a film comprising polyvinyl alcohol (PVOH).

Other Adjunct Ingredients

A wide variety of other ingredients may be used in the detergent compositions herein, including other active ingredients, carriers, hydrotropes, processing aids, dyes or pigments, solvents for liquid formulations, and solid or other liquid fillers, erythrosine, colliodal silica, waxes, probiotics, surfactin, aminocellulosic polymers, Zinc Ricinoleate, perfume microcapsules, rhamnolipids, sophorolipids, glycopeptides, methyl ester sulfonates, methyl ester ethoxylates, sulfonated estolides, cleavable surfactants, biopolymers, silicones, modified silicones, aminosilicones, deposition aids, locust bean gum, cationic hydroxyethylcellulose polymers, cationic guars, hydrotropes (especially cumenesulfonate salts, toluenesulfonate salts, xylenesulfonate salts, and naphalene salts), antioxidants, BHT, PVA particle-encapsulated dyes or perfumes, pearlescent agents, effervescent agents, color change systems, silicone polyurethanes, opacifiers, tablet disintegrants, biomass fillers, fast-dry silicones, glycol distearate, hydroxyethylcellulose polymers, hydrophobically modified cellulose polymers or hydroxyethylcellulose polymers, starch perfume encapsulates, emulsified oils, bisphenol antioxidants, microfibrous cellulose structurants, properfumes, styrene/acrylate polymers, triazines, soaps, superoxide dismutase, benzophenone protease inhibitors, functionalized TiO2, dibutyl phosphate, silica perfume capsules, and other adjunct ingredients, silicate salts (e.g., sodium silicate, potassium silicate), choline oxidase, pectate lyase, mica, titanium dioxide coated mica, bismuth oxychloride, and other actives.

The compositions described herein may also contain vitamins and amino acids such as: water soluble vitamins and their derivatives, water soluble amino acids and their salts and/or derivatives, water insoluble amino acids viscosity modifiers, dyes, nonvolatile solvents or diluents (water soluble and insoluble), pearlescent aids, foam boosters, additional surfactants or nonionic cosurfactants, pediculocides, pH adjusting agents, perfumes, preservatives, chelants, proteins, skin active agents, sunscreens, UV absorbers, vitamins, niacinamide, caffeine, and minoxidil.

The compositions of the present invention may also contain pigment materials such as nitroso, monoazo, disazo, carotenoid, triphenyl methane, triaryl methane, xanthene, quinoline, oxazine, azine, anthraquinone, indigoid, thionindigoid, quinacridone, phthalocianine, botanical, and natural colors, including water soluble components such as those having C.I. Names. The detergent compositions of the present invention may also contain antimicrobial agents.

Water

The compositions disclosed herein may comprise from about 1% to about 80%, by weight of the composition, water. When the composition is a heavy duty liquid detergent composition, the composition typically comprises from about 40% to about 80% water. When the composition is a compact liquid detergent, the composition typically comprises from about 20% to about 60%, or from about 30% to about 50% water. When the composition is in unit dose form, for example, encapsulated in water-soluble film, the composition typically comprises less than 20%, or less than 15%, or less than 12%, or less than 10%, or less than 8%, or less than 5% water. The composition may comprise from about 1% to 20%, or from about 3% to about 15%, or from about 5% to about 12%, by weight of the composition, water. When the composition is in unitized dose form, for example, encapsulated in water-soluble film, the composition typically comprises less than 20%, or less than 15%, or less than 12%, or less than 10%, or less than 8%, or less than 5% water. The composition may comprise from about 1% to 20%, or from about 3% to about 15%, or from about 5% to about 12%, by weight of the composition, water.

Methods of Use

The present invention includes methods for cleaning soiled material. Compact fluid detergent compositions that are suitable for sale to consumers are suited for use in laundry pretreatment applications, laundry cleaning applications, and home care applications.

Such methods include, but are not limited to, the steps of contacting detergent compositions in neat form or diluted in wash liquor, with at least a portion of a soiled material and then optionally rinsing the soiled material. The soiled material may be subjected to a washing step prior to the optional rinsing step.

For use in laundry pretreatment applications, the method may include contacting the detergent compositions described herein with soiled fabric. Following pretreatment, the soiled fabric may be laundered in a washing machine or otherwise rinsed.

Machine laundry methods may comprise treating soiled laundry with an aqueous wash solution in a washing machine having dissolved or dispensed therein an effective amount of a machine laundry detergent composition in accord with the invention. An "effective amount" of the detergent composition means from about 20 g to about 300 g of product dissolved or dispersed in a wash solution of volume from about 5 L to about 65 L. The water temperatures may range from about 5° C. to about 100° C. The water to soiled material (e.g., fabric) ratio may be from about 1:1 to about 30:1. The compositions may be employed at concentrations of from about 500 ppm to about 15,000 ppm in solution. In the context of a fabric laundry composition, usage levels may also vary depending not only on the type and severity of the soils and stains, but also on the wash water temperature, the volume of wash water, and the type of washing machine (e.g., top-loading, front-loading, top-loading, vertical-axis Japanese-type automatic washing machine).

The detergent compositions herein may be used for laundering of fabrics at reduced wash temperatures. These methods of laundering fabric comprise the steps of delivering a laundry detergent composition to water to form a wash liquor and adding a laundering fabric to said wash liquor, wherein the wash liquor has a temperature of from about 0° C. to about 20° C., or from about 0° C. to about 15° C., or from about 0° C. to about 9° C. The fabric may be contacted to the water prior to, or after, or simultaneous with, contacting the laundry detergent composition with water.

Another method includes contacting a nonwoven substrate, which is impregnated with the detergent composition, with a soiled material. As used herein, "nonwoven substrate"

can comprise any conventionally fashioned nonwoven sheet or web having suitable basis weight, caliper (thickness), absorbency, and strength characteristics. Non-limiting examples of suitable commercially available nonwoven substrates include those marketed under the tradenames SONTARA® by DuPont and POLYWEB® by James River Corp.

Hand washing/soak methods, and combined handwashing with semi-automatic washing machines, are also included.

Packaging for the Compositions

The compact fluid detergent compositions that are suitable for consumer use can be packaged in any suitable container including those constructed from paper, cardboard, plastic materials, and any suitable laminates. The compact fluid detergent compositions may also be encapsulated in water-soluble film and packaged as a unitized dose detergent composition, for example, mono-compartment pouches or multi-compartment pouches having superposed and/or side-by-side compartments.

EXAMPLES

In the following examples, the individual ingredients within the cleaning compositions are expressed as percentages by weight of the cleaning compositions.

Synthesis Examples $^1$H-NMR and $^{13}$C-NMR measurements are carried out in CDCl$_3$ with a Bruker 400 MHz spectrometer.

The degree of amination is calculated from the total amine value (AZ) divided by sum of the total acetylables value (AC) and tertiary amine value (tert. AZ) multiplied by 100: (Total AZ: (AC+tert. AZ)×100). The total amine value (AZ) is determined according to DIN 16945. The total acetylables value (AC) is determined according to DIN 53240. The secondary and tertiary amine are determined according to ASTM D2074-07. The primary amines value is calculated as follows: primary amine value=AZ−secondary+tertiary amine value. Primary amine in % of total amine is calculated as follows: Primary amine in %=((AZ−secondary+tertiary amine value)/AZ)*100. The hydroxyl value is calculated from (total acetylables value+tertiary amine value)−total amine value.

Example 1

Example 1a: 1 mol 2-butyl-2-ethyl-1,3-propanediol+2.0 mol acrylonitrile

In a 4-neck glass vessel with reflux condenser, nitrogen inlet, thermometer, and dropping funnel, 216.3 g molten 2-butyl-2-ethyl-1,3-propanediol and 3.1 g tetrakis(2-hydroxyethyl)ammonium hydroxide (50% in water) is charged at 50° C. The temperature is increased to 60° C. and 171.9 g acrylonitrile is added dropwise within 1.0 h. During the addition the temperature is allowed to rise to 70° C. The reaction mixture is stirred at 60° C. for 3 h and filtered and volatile compounds are removed in vacuo. 353.0 g of a orange liquid is obtained. $^1$H-NMR in CDCL$_3$ showed complete conversion of acrylonitrile.

Example 1b: 1 mol 2-butyl-2-ethyl-1,3-propanediol+2.0 mol acrylonitrile, hydrogenated The nitrile is continuously hydrogenated in a tubular reactor (length 500 mm, diameter 18 mm) filled with a splitted cobalt catalyst prepared as described in EP636409. At a temperature of 110° C. and a pressure of 160 bar, 15.0 g of a solution of the nitrile in THF (20%), 24.0 g of ammonia and 16 norm litre (NL) of hydrogen are passed through the reactor per hour. The crude material is collected and stripped on a rotary evaporator to remove excess ammonia, light weight amines and THF to produce the hydrogenated product. $^1$H and $^{13}$C-NMR analysis shows full conversion of the nitrile. The analytical data by means of titration is summarized in table 1.

TABLE 1

| Total amine-value mg KOH/g | Total acetylables value mg KOH/g | Secondary and tertiary amine mg KOH/g | Tertiary amine-value mg KOH/g | Degree of amination in % | Primary Amine value in % of total amine |
|---|---|---|---|---|---|
| 408.3 | 408.7 | 1.87 | 1.78 | 99.5 | 99.5 |

Example 2

Example 2a: 1 mol 2-butyl-2-ethyl-1,3-propanediol+1.2 mol acrylonitrile

In a 4-neck glass vessel with reflux condenser, nitrogen inlet, thermometer, and dropping funnel, 240.4 g molten 2-butyl-2-ethyl-1,3-propanediol and 3.5 g tetrakis(2-hydroxyethyl)ammonium hydroxide (50% in water) is charged at 50° C. The temperature is increased to 60° C. and 95.5 g acrylonitrile is added dropwise within 1.0 h at 60-70° C. The reaction mixture is stirred at 60° C. for 3 h and filtered and volatile compounds are removed in vacuo. 372.0 g of a light yellow liquid is obtained. $^1$H-NMR in CDCl$_3$ shows complete conversion of acrylonitrile.

Example 2b: 1 mol 2-butyl-2-ethyl-1,3-propanediol+1.2 mol acrylonitrile, hydrogenated The nitrile is continuously hydrogenated in a tubular reactor (length 500 mm, diameter 18 mm) filled with a splitted cobalt catalyst prepared as described in EP636409. At a temperature of 110° C. and a pressure of 160 bar, 15.0 g of a solution of the nitrile in THF (20%), 24.0 g of ammonia and 16 NL of hydrogen are passed through the reactor per hour. The crude material is collected and stripped on a rotary evaporator to remove excess ammonia, light weight amines and THF to produce the hydrogenated product. $^1$H and $^{13}$C-NMR analysis shows full conversion of the nitrile. The analytical data by means of titration is summarized in table 2.

TABLE 2

| Total amine-value mg KOH/g | Total acetylables value mg KOH/g | Secondary and tertiary amine value mg KOH/g | Tertiary amine-value mg KOH/g | Degree of amination in % | Primary Amine value in % of total amine |
|---|---|---|---|---|---|
| 278.8 | 501.5 | 1.8 | 1.4 | 55.4 | 99.4 |

Example 3

Example 3a: 1 mol 2-ethyl-1,3-hexanediol+2.0 mol acrylonitrile

In a 4-neck glass vessel with reflux condenser, nitrogen inlet, thermometer, and dropping funnel, 197.4 g 2-ethyl-1,3-hexanediol and 3.2 g tetrakis(2-hydroxyethyl)ammonium hydroxide (50% in water) is charged at 50° C. The temperature is increased to 60° C. and 186.2 g acrylonitrile is added dropwise within 1.0 h at 60-70° C. The reaction mixture is stirred at 60° C. for 3 h and filtered and volatile compounds are removed in vacuo. 375.0 g of a dark yellow liquid is obtained. $^1$H-NMR in CDCl$_3$ shows complete conversion of acrylonitrile.

Example 3b: 1 mol 2-ethyl-1,3-hexanediol+2.0 mol acrylonitrile, hydrogenated The nitrile is continuously hydrogenated in a tubular reactor (length 500 mm, diameter 18 mm) filled with a splitted cobalt catalyst prepared as described in EP636409. At a temperature of 110° C. and a pressure of 160 bar, 15.0 g of a solution of the nitrile in THF (20%), and 16 NL of hydrogen are passed through the reactor per hour. The crude material is collected and stripped on a rotary evaporator to remove excess ammonia, light weight amines and THF to produce the hydrogenated product. $^1$H and $^{13}$C-NMR analysis shows full conversion of the nitrile. The analytical data by means of titration is summarized in table 3.

TABLE 3

| Total amine-value mg KOH/g | Total acetylables value mg KOH/g | Secondary and tertiary amine value mg KOH/g | Tertiary amine-value mg KOH/g | Degree of amination in % | Primary Amine value in % of total amine |
|---|---|---|---|---|---|
| 376.4 | 471.3 | 15.8 | 1.8 | 79.6 | 95.8 |

Comparative Examples

Comparative Example 1a: 1 mol 2-butyl-2-ethyl-1,3-propandiol+5.6 mol propylene oxide In a 2 l autoclave, 1286.7 g 2-Butyl-2-ethyl-1,3-propane diol and 15.5 g KOH (50% in water) are mixed and stirred under vacuum (<10 mbar) at 90° C. for 2 h. The autoclave is purged with nitrogen and heated to 140° C. 2612.0 g propylene oxide is added within 26 h. To complete the reaction, the mixture is allowed to post-react for additional 10 h at 140° C. The reaction mixture is stripped with nitrogen and volatile compounds are removed in vacuo at 80° C. The catalyst is removed by adding 211.0 g water and 33.9 g phosphoric acid (40% in water) stirring at 100° C. for 0.5 h and dewatering in vacuo for 2 hours. After filtration 3901.0 g of a light yellowish oil is obtained (hydroxy value: 190 mgKOH/g).

Comparative example 1b: 1 mol 2-butyl-2-ethyl-1,3-propandiol+5.6 mol propylene oxide, aminated The amination of 2-butyl-2-ethyl-1,3-propanediol+2.8 PO/OH (1) is conducted in a tubular reactor (length 500 mm, diameter 18 mm) which is charged with 15 mL of silica (3×3 mm pellets) followed by 70 mL (74 g) of the catalyst precursor (containing oxides of nickel, cobalt, copper and tin on gama-Al$_2$O$_3$, 1,0-1,6 mm split—prepared according to WO 2013/072289 A1) and filled up with silica (ca. 15 mL). After catalyst activation, the alcohol is aminated at a WHSV of 0.19 kg/liter*h (molar ratio ammonia/alcohol=55:1, hydrogen/alcohol=11.6:1) at 206° C. The crude material is collected and stripped on a rotary evaporator to remove excess ammonia, light weight amines and reaction water to produce aminated (1). The analytical data of the reaction product is shown below.

| Total amine-value mg KOH/g | Total acetylatables mg KOH/g | Secondary and tertiary amine value mg KOH/g | Tertiary amine-value mg KOH/g | Hydroxyl value mg KOH/g | Degree of amination in % | Primary Amine value in % of total amine |
|---|---|---|---|---|---|---|
| 222.92 | 231.50 | 2.57 | 0.31 | 8.89 | 96.16 | 98.85 |

Example 4-Comparative Grease Stain Removal from Laundry Detergent Compositions The following laundry detergent composition is prepared by traditional means known to those of ordinary skill in the art by mixing the listed ingredients.

TABLE 1

Detergent Composition DC1

| Ingredients of liquid detergent composition DC1 | percentage by weight |
|---|---|
| Alkyl Benzene sulfonate [1] | 7.50% |
| AE3S [2] | 2.60% |
| AE9 [3] | 0.40% |
| NI 45-7 [4] | 4.40% |
| Citric Acid | 3.20% |
| C1218 Fatty acid | 3.10% |
| Amphiphilic polymer [5] | 0.50% |
| Zwitterionic dispersant [6] | 1.00% |
| Ethoxylated Polyethyleneimine [7] | 1.51% |
| Protease [8] | 0.89% |
| Enymes [9] | 0.21% |
| Chelant [10] | 0.28% |
| Brightener [11] | 0.09% |
| Solvent | 7.35% |
| Sodium Hydroxide | 3.70% |
| Fragrance & Dyes | 1.54% |
| Water, filler, stucturant | To Balance |

[1] Linear alkylbenenesulfonate having an average aliphatic carbon chain length C11-C12 supplied by Stepan, Northfield Illinois, USA
[2] AE3S is C12-15 alkyl ethoxy (3) sulfate supplied by Stepan, Northfield, Illinois,USA
[3] AE9 is C12-14 alcohol ethoxylate, with an average degree of ethoxylation of 9, supplied by Huntsman, Salt Lake City, Utah, USA
[4] NI 45-7 is C14-15 alcohol ethoxylate, with an average degree of ethoxylation of 7, supplied by Huntsman, Salt Lake City, Utah, USA
[5] Random graft copolymer is a polyvinyl acetate grafted polyethylene oxide copolymer having a polyethylene oxide backbone and multiple polyvinyl acetate side chains. The molecular weight of the polyethylene oxide backbone is about 6000 and the weight ratio of the polyethylene oxide to polyvinyl acetate is about 40 to 60 and no more than 1 grafting point per 50 ethylene oxide units.
[6] A compound having the following general structure: bis((C2H5O)(C2H4O)n)(CH3)—N+—CxH2x—N+—(CH3)-bis((C2H5O)(C2H4O)n), wherein n = from 20 to 30, and x = from 3 to 8, or sulphated or sulphonated variants thereof
[7] Polyethyleneimine (MW = 600) with 20 ethoxylate groups per —NH TABLE 1-continued Detergent Composition DC1

Ingredients of liquid detergent composition DC1   percentage by weight

[8] Proteases may be supplied by Genencor International, Palo Alto, California, USA (e.g. Purafect Prime ®) or by Novozymes, Bagsvaerd, Denmark (e.g. Liquanase ®, Coronase ®).

[9] Natalase ®, Mannaway ® are all products of Novozymes, Bagsvaerd, Denmark.

[10] Suitable chelants are, for example, diethylenetetraamine pentaacetic acid (DTPA) supplied by Dow Chemical, Midland, Michigan, USA or Hydroxyethane di phosphonate (HEDP) or diethylene triamine penta(methyl phosphonic) acid supplied by Solutia, St Louis, Missouri, USA;

[11] Fluorescent Brightener 1 is Tinopal ® AMS, Fluorescent Brightener 2 supplied by Ciba Specialty Chemicals, Basel, Switzerland.

Technical stain swatches of blue knitted cotton containing Beef Fat, Pork Fat, Chicken Fat and Bacon Grease are purchased from Warwick Equest Ltd. The stains are washed for 30 min in a launder-o-meter (manufactured by SDL Atlas) at room temperature using per canister 500 mL of washing solution, 20 steel balls (weight of 1 ball is 1 g) and ballast fabrics. The washing solution contains 5000 ppm of detergent composition DC1 (table 1). Water hardness is 2.5 mM (Ca2+: Mg2+ molar ratio was 4:1). Additives are added to the washing solution of each canister separately and in the amount as detailed below. After addition the pH value is re-adjusted to the pH value of washing solution without additive.

Standard colorimetric measurement is used to obtain L*, a* and b* values for each stain before and after the washing. From L*, a* and b* values, the stain level is calculated as color difference ΔE (calculated according to DIN EN ISO 11664-4) between stain and untreated fabric.

Stain removal from the swatches is calculated as follows:

$$\text{Stain Removal Index (SRI)} = \frac{(\Delta E_{initial} - \Delta E_{washed})}{\Delta E_{initial}} \times 100$$

$\Delta E_{initial}$ = Stain level before washing $\Delta E_{washed}$ = Stain level after washing Stain level corresponds to the amount of grease on the fabric. The stain level of the fabric before the washing ($\Delta E_{initial}$) is high; in the washing process, stains are removed and the stain level after washing is reduced ($\Delta E_{washed}$). The better a stain has been removed, the lesser the value for $\Delta E_{washed}$ and the greater the difference between $\Delta E_{initial}$ and $\Delta E_{washed}$ ($\Delta E_{initial} - \Delta E_{washed}$). Therefore, the value of the stain removal index increases with better washing performance

TABLE 2

Washing Test 1

| Additive | additive/ [g] | SRI, Beef Fat | SRI, Pork Fat | SRI, Chicken Fat | SRI, Bacon Grease |
|---|---|---|---|---|---|
| without additive | — | 27.2 | 24.9 | 25.5 | 39.3 |
| Comparative example 1b | 0.0375 | 41.0 | 36.9 | 40.4 | 51.0 |
| Example 1b | 0.0375 | 43.0 | 42.5 | 44.5 | 60.0 |

TABLE 3

Washing Test 2

| Additive | additive/ [g] | SRI, Beef Fat | SRI, Pork Fat | SRI, Chicken Fat | SRI, Bacon Grease |
|---|---|---|---|---|---|
| without additive | — | 27.8 | 27.4 | 22.8 | 37.5 |
| Example 3b | 0.0375 | 36.9 | 37.3 | 34.9 | 52.2 |

The washing test with Examples 1b (Table 2) shows improved stain removal compared to Comparative Example 1b. The washing test with Examples 3b (Table 2) shows improved stain removal compared to Detergent Composition DC1 without additive.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm".

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern."

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method of forming an etheramine:
   the method comprising reductive cyanoethylation of an alkoxylated 1,3-diol mixture with an acrylonitrile in the presence of a base followed by hydrogentation with hydrogen and a catalyst to form an etheramine of Formula (I), Formula (II), or a mixture thereof:

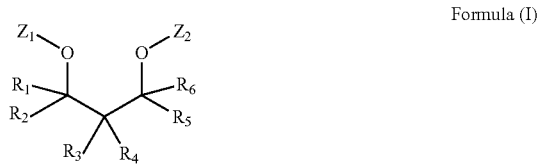

Formula (I)

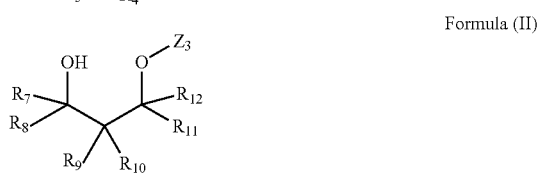

Formula (II)

wherein each of $R_1$-$R_{12}$ is independently selected from H, alkyl, cycloalkyl, aryl, alkylaryl, or arylalkyl, wherein at least one of $R_1$-$R_6$ and at least one of $R_7$-$R_{12}$ is different from H, and wherein each of $Z_1$-$Z_3$ is linear $CH_2CH_2CH_2NH_2$.

2. The method of claim 1, wherein the degree of amination of said etheramine of Formula (I) and/or Formula (II) is equal to or greater than about 50%.

3. The method of claim 1, wherein said etheramine comprises an etheramine mixture comprising at least 95%, by weight of said etheramine mixture, of said etheramine of Formula (I), said etheramine of Formula (II), or a mixture thereof.

4. The method of claim 1, wherein in said etheramine of Formula (I) or Formula (II), each of $R_1$, $R_2$, $R_5$, $R_6$, $R_7$, $R_8$, $R_{11}$, and $R_{12}$ is H and each of $R_3$, $R_4$, $R_9$, and $R_{10}$ is independently selected from C1-C16 alkyl or aryl.

5. The method of claim 4, wherein in said etheramine of Formula (I) or Formula (II), each of $R_3$, $R_4$, $R_9$, and $R_{10}$ is independently selected from a butyl group, an ethyl group, a methyl group, a propyl group, or a phenyl group.

6. The method of claim 1, wherein in said etheramine of Formula (I) or Formula (II), each of $R_3$ and $R_9$ is an ethyl group, each of $R_4$ and $R_{10}$ is a butyl group, and each of $R_1$, $R_2$, $R_5$, $R_6$, $R_7$, $R_8$, $R_{11}$, and $R_{12}$ is H.

7. The method of claim 1, wherein in said etheramine of Formula (I) or Formula (II), each of $R_1$, $R_2$, $R_7$, and $R_8$ is H and each of $R_3$, $R_4$, $R_5$, $R_6$, $R_9$, $R_{10}$, $R_{11}$, and $R_{12}$ is independently selected from an ethyl group, a methyl group, a propyl group, a butyl group, a phenyl group, or H.

8. The method of claim 1, wherein said etheramine has a weight average molecular weight of about 150 to about 1000 grams/mole.

9. The method of claim 1, wherein said etheramine has a weight average molecular weight of about 150 to about 900 grams/mole.

10. The method of claim 1, wherein said etheramine has a weight average molecular weight of about 150 to about 450 grams/mole.

11. The method of claim 1, wherein the base comprises alkaline hydroxides and substituted ammonium hydroxide.

12. The method of claim 11, wherein the base is Tetrakis (2-hydroxyethyl)ammonium hydroxide.

13. The method of claim 1, wherein the catalyst for hydrogenation of the nitrile function to the corresponding amine comprises one or more of Fe, Co, Ni, Ru, Rh, Pd, Os, Ir, or Pt.

\* \* \* \* \*